United States Patent
Tsai et al.

(10) Patent No.: US 10,277,215 B2
(45) Date of Patent: Apr. 30, 2019

(54) DIGITAL CONTROLLED DELAY LINE

(71) Applicant: Taiwan Semiconductor Manufacturing Co., Ltd., Hsinchu (TW)

(72) Inventors: Meng-Ting Tsai, Hsinchu (TW); Chien-Chun Tsai, Jhudong Township, Hsinchu County (TW); Mu-Shan Lin, Hsinchu (TW); Wen-Hung Huang, Hsinchu (TW); Yu-Chi Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 60 days.

(21) Appl. No.: 15/581,033

(22) Filed: Apr. 28, 2017

(65) Prior Publication Data

US 2018/0316337 A1    Nov. 1, 2018

(51) Int. Cl.
| H03K 5/13 | (2014.01) |
| H03K 5/131 | (2014.01) |
| H03K 5/133 | (2014.01) |
| H03K 5/00 | (2006.01) |

(52) U.S. Cl.
CPC ............ *H03K 5/131* (2013.01); *H03K 5/133* (2013.01); *H03K 2005/00058* (2013.01)

(58) Field of Classification Search
CPC .................................. H03K 5/14; H03K 5/131
See application file for complete search history.

(56) References Cited

U.S. PATENT DOCUMENTS

| 6,025,744 | A | 2/2000 | Bertolet et al. |
| 7,486,125 | B2 * | 2/2009 | Chae ........................ H03K 5/131 327/272 |
| 7,932,765 | B2 * | 4/2011 | Kapusta ................. H03K 5/133 327/269 |
| 9,490,785 | B1 * | 11/2016 | Sridhar .................... H03K 5/06 |
| 2014/0028366 | A1 | 1/2014 | Chou |
| 2015/0244357 | A1 | 8/2015 | Huang et al. |

OTHER PUBLICATIONS

Caro, D.D.; "Glitch-free NAND-based digitally controlled delay-lines;" IEEE Transactions on Very Large Scale Integration (VLSI) Systems; vol. 21; No. 1; Jan. 2013; pp. 55-66.
Lee, Y., et al.; "Single-step glitch-free NAND-based digitally controlled delay lines using dual loops," Electronics Letters; Jun. 2014; pp. 1-2.

* cited by examiner

*Primary Examiner* — Hai L Nguyen
(74) *Attorney, Agent, or Firm* — McClure, Qualey & Rodack, LLP

(57) ABSTRACT

Digital controlled delay lines are provided. A digital controlled delay line includes a plurality of delay cells coupled in a chain forming a propagation path to propagate an input signal and to delay the input signal by a delay time. The propagation path is formed when a single delay cell is operated in a feedback mode, the delay cells previous to the single delay cell in the chain are operated in a propagation mode, a subsequent delay cell following the single delay cell in the chain is operated in a standby mode, and the delay cells following the first subsequent delay cell in the chain are operated in an idle mode.

20 Claims, 9 Drawing Sheets

DIGITAL CONTROLLED DELAY LINE

BACKGROUND

In integrated circuits (ICs), internal clock signals are usually generated by a digital controlled delay line (DCDL) of a delay-locked loop (DLL). In general, a DCDL is used to prevent an external clock signal from arriving at an output until a predetermined time has elapsed. The DCDL typically contains several delay cells, with each of the delay cells having a corresponding delay time. The total delay time of the DCDL can be set by increasing or decreasing the number of delay cells that a signal passes through. To achieve finer granularity of delay-time adjustment, the DCDL includes a huge amount of delay cells that can be adjusted.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
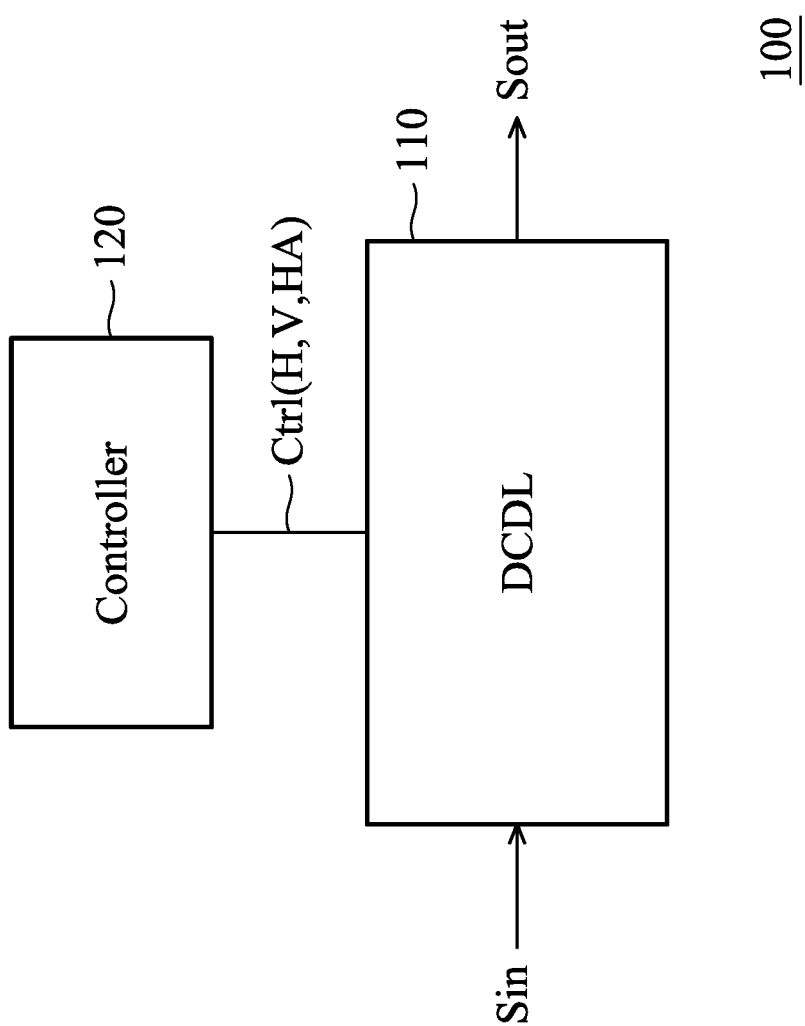
FIG. 1 shows a delay circuit, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a delay circuit 100, in accordance with some embodiments of the disclosure. The delay circuit 100 is capable of delaying an input signal Sin by a specific delay time to provide an output signal Sout. The delay circuit 100 includes a controller 120 and a digital controlled delay line (DCDL) 110. The controller 120 is capable of providing a control signal Ctrl corresponding to the specific delay time. In response to the control signal Ctrl, the DCDL 110 is capable of providing the output signal Sout by delaying the input signal Sin by the specific delay time.

In some embodiments, the controller 120 provides the control signal Ctrl according to a signal with multi bits from other circuits. In order to decrease routing area for the bits of the signal from the other circuits, a Gray code can be applied to reduce numbers of from $2^n$ to n. Gray code is a binary numeral system where two successive values differ in only one bit which can prevent spurious output. The controller 120 may include a specific decoder for decoding the Gray code into the control bits (H[n:0], V[n:0], HA[n:0]) of the control signal Ctrl. In some embodiments, the control bits (H[n:0], V[n:0], HA[n:0]) of the control signal Ctrl corresponding to the Gray code are used to control the device-switching operation of the DCDL 110, so as to switch a single device in the DCDL 110, and then interference caused by device-switching is decreased. The device-switching operation of the DCDL 110 will be discussed in details later.

In some embodiments, the delay circuit 100 is used to process a clock signal. When the process, supply voltage, or temperature (PVT) varies, the delay circuit 100 is capable of dynamically adjusting the specific delay time, so as to provide a suitable clock for subsequent applications or circuits.

Figure 2:
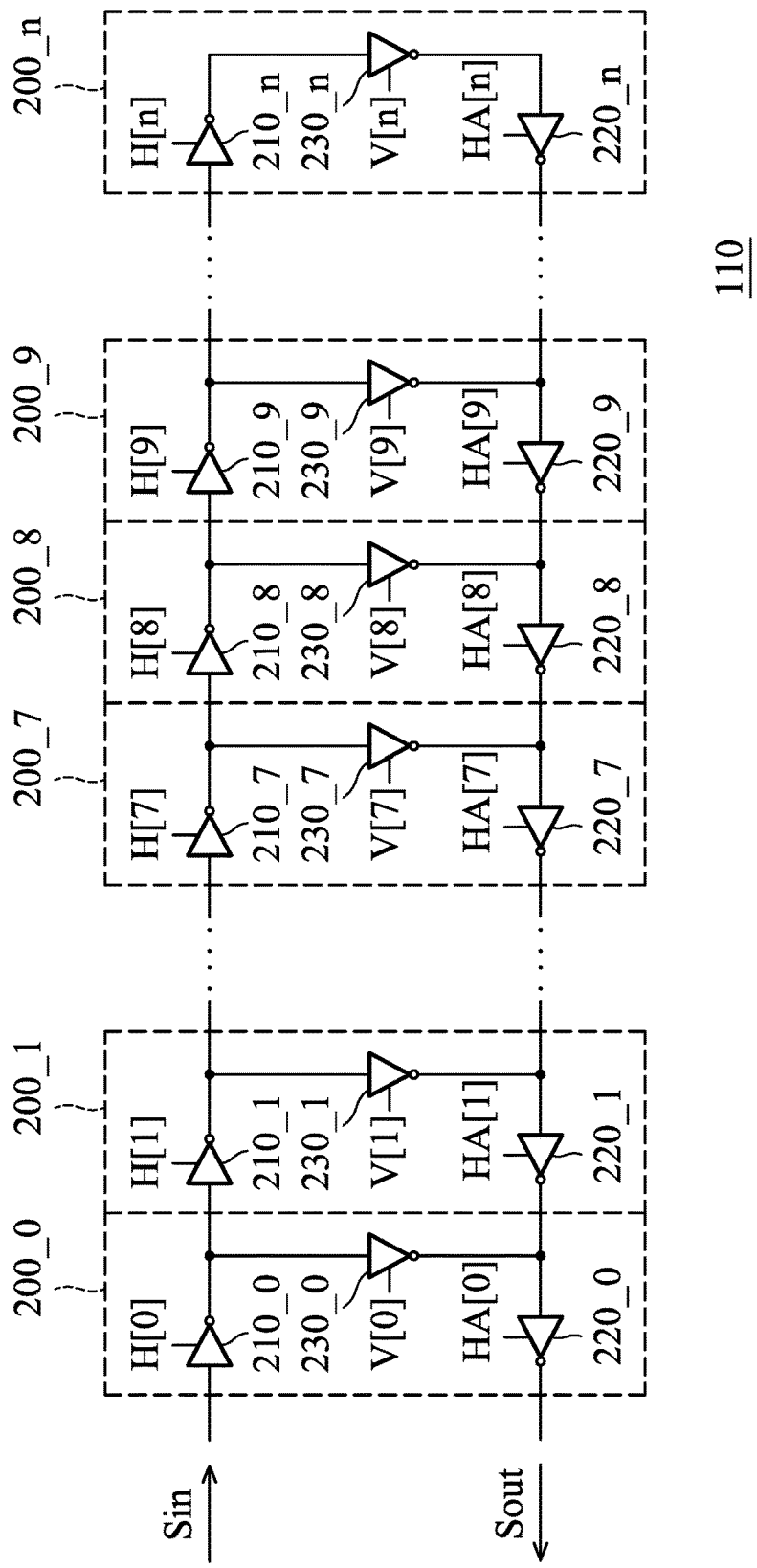
FIG. 2 shows the DCDL of FIG. 1, in accordance with some embodiments of the disclosure.

FIG. 2 shows the DCDL 110 of FIG. 1, in accordance with some embodiments of the disclosure. The DCDL 110 includes multiple delay cells 200_0 to 200_n, and the delay cells 200_0 to 200_n are connected in a chain. In such embodiments, the delay cells 200_0 to 200_n have the same circuits. Each of the delay cells 200_0 to 200_n includes three tri-state inverters 210, 220 and 230, and each tri-state inverter is controlled by an individual control bit of the control signal Ctrl. When the tri-state inverter is enabled by its control bit, the tri-state inverter is capable of inverting an input signal to provide an output signal, i.e. the output signal is complementary to the input signal for the tri-state inverter.

Conversely, when the tri-state inverter is disabled by its control bit, the tri-state inverter is capable of providing a high-impedance (Hi-Z) signal.

In some embodiments, the control signal Ctrl from the controller 120 includes three sets of control bits. A first set of control bits H[0] to H[n] are used to control the tri-state inverters 210_0 to 210_n, respectively, and the tri-state inverters 210_0 to 210_n are coupled in series. In some embodiments, the tri-state inverter 210_0 of the delay cell 200_0 (i.e. the first stage of the delay cell in the chain) can be omitted. A second set of control bits HA[0] to HA[n] are used to control the tri-state inverters 220_0 to 220_n, respectively, and the tri-state inverters 220_0 to 220_n are coupled in series. A third set of control bits V[0] to V[n] are used to control the tri-state inverters 230_0 to 230_n, respectively.

Taking the delay cell 200_8 as an example, in the chain formed by the delay cells 200_0 to 200_n, the delay cell 200_7 is a previous delay cell (e.g., a previous stage of the delay cell) and the delay cell 200_9 is a subsequent (or next) delay cell (e.g., a subsequent stage of the delay cell) for the delay cell 200_8. The delay cell 200_8 includes the tri-state inverters 210_8, 220_8 and 230_8.

The tri-state inverter 210_8 is controlled by the control bit H[8]. The tri-state inverter 210_8 has an input terminal coupled to the tri-state inverter 210_7 of the delay cell 200_7, and an output terminal coupled to the tri-state inverter 210_9 of the delay cell 200_9. When the tri-state inverter 210_8 is enabled by the control bit H[8], the tri-state inverter 210_8 is capable of inverting a signal from the previous delay cell 200_7 and providing the inverted signal to the subsequent delay cell 200_9. When the tri-state inverter 210_8 is disabled by the control bit H[8], the tri-state inverter 210_8 is capable of providing a high-impedance output to the subsequent delay cell 200_9. In some embodiments, a high-impedance output represents that no current flows at an output terminal of a tri-state inverter. Therefore, when the tri-state inverter 210_8 is enabled, the signal from the previous delay cell 200_7 can be propagated to the subsequent delay cell 200_9 via the tri-state inverter 210_8. Conversely, when the tri-state inverter 210_8 is disabled, the signal from the previous delay cell 200_7 is blocked from propagating to the following delay cells 200_9 to 200_n, and the node between the tri-state inverters 210_8, 210_9 and 230_8 is floating due to a high-impedance output from the tri-state inverter 210_8.

The tri-state inverter 220_8 is controlled by the control bit HA[8]. The tri-state inverter 220_8 has an input terminal coupled to the tri-state inverter 220_9 of the delay cell 200_9 and an output terminal coupled to the tri-state inverter 220_7 of the delay cell 200_7. When the tri-state inverter 220_8 is enabled by the control bit HA[8], the tri-state inverter 220_8 is capable of inverting a signal from the delay cell 200_9 and providing the inverted signal to the delay cell 200_7. When the tri-state inverter 220_8 is disabled by the control bit HA[8], the tri-state inverter 220_8 is capable of providing a high-impedance output to the previous delay cell 200_7. Therefore, when the tri-state inverter 220_8 is enabled, the signal from the subsequent delay cell 200_9 can be propagated to the previous delay cell 200_7 via the tri-state inverter 220_8. Conversely, when the tri-state inverter 220_8 is disabled, the signal from the previous delay cell 200_9 is blocked from propagating to the preceding delay cells 200_7 to 200_n.

The tri-state inverter 230_8 is controlled by the control bit V[8]. The tri-state inverter 230_8 has an input terminal coupled to the tri-state inverter 210_8 and an output terminal coupled to the tri-state inverter 220_8 in the delay cell 200_8. Furthermore, the input terminal of the tri-state inverter 230_8 is further coupled to an input terminal of the tri-state inverter 210_9, and the output terminal of the tri-state inverter 230_8 is further coupled to an output terminal of the tri-state inverter 220_9. When the tri-state inverter 230_8 is enabled by the control bit V[8], the tri-state inverter 230_8 is capable of inverting a signal from the tri-state inverter 210_8 and providing the inverted signal to the tri-state inverter 220_8. When the tri-state inverter 230_8 is disabled by the control bit V[8], the tri-state inverter 230_8 is capable of providing a high-impedance output to the tri-state inverter 220_8. Therefore, when the tri-state inverter 230_8 is enabled, the signal from the tri-state inverter 210_8 can be propagated to the tri-state inverter 220_8 via the tri-state inverter 230_8. Conversely, when the tri-state inverter 230_8 is disabled, the signal from the tri-state inverter 210_8 is blocked from propagating to the tri-state inverter 220_8.

By enabling and disabling the three tri-state inverters 210, 220 and 230 in the delay cell 200, each delay cell can operate in different modes.

Figure 3B:
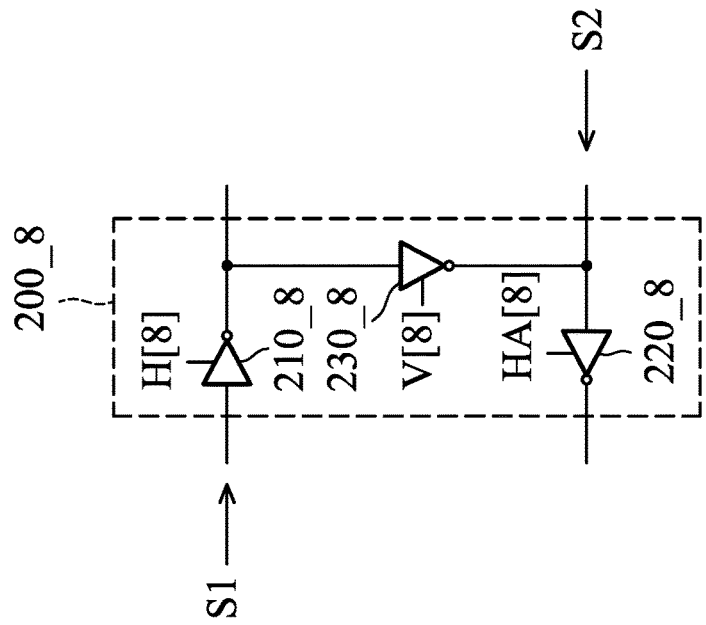
FIG. 3B shows a feedback mode of the delay cell, in accordance with some embodiments of the disclosure.
Figure 3A:
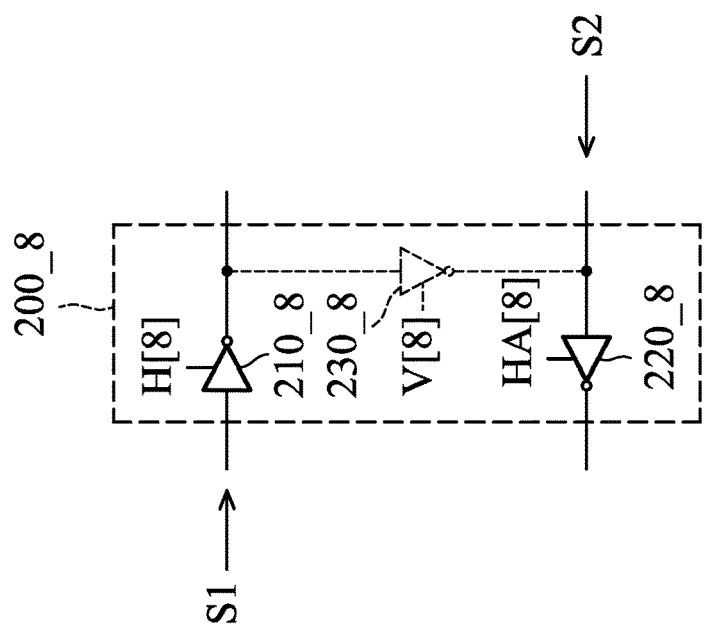
FIG. 3A shows a propagation mode of the delay cell, in accordance with some embodiments of the disclosure.

Taking the delay cell 200_8 as an example, FIG. 3A shows a propagation mode of the delay cell 200_8, in accordance with some embodiments of the disclosure. In the propagation mode, the tri-state inverter 210_8 is enabled by the control bit H[8], and a signal S1 from the delay cell 200_7 is inverted and propagated to the delay cell 200_9. Furthermore, the tri-state inverter 220_8 is enabled by the control bit HA[8], and a signal S2 (e.g., a return signal) from the delay cell 200_9 is inverted and propagated to the delay cell 200_7. Moreover, the tri-state inverter 230_8 is disabled by the control bit V[8], and no feedback path is formed in the delay cell 200_8. Therefore, in the propagation mode for each delay cell, the signal from a previous stage of the delay cell is propagated to a subsequent stage of the delay cell, and the signal from the subsequent stage of the delay cell is propagated to the previous stage of the delay cell.

FIG. 3B shows a feedback mode of the delay cell 200_8, in accordance with some embodiments of the disclosure. In the feedback mode, the tri-state inverter 210_8 is enabled by the control bit H[8], and a signal S1 from the delay cell 200_7 is inverted and propagated to the delay cell 200_9. Moreover, the tri-state inverter 230_8 is enabled by the control bit V[8], and the signal propagated by the tri-state inverter 210_8 is inverted and propagated to the tri-state inverter 220_8, e.g., a signal to be feedback. Furthermore, the tri-state inverter 220_8 is enabled by the control bit HA[8] and a feedback path is formed via the tri-state inverter 230_8, and the signal propagated by the tri-state inverter 230_8 is inverted and propagated to the delay cell 200_7. Therefore, in the feedback mode for each delay cell, the signal from a previous stage of the delay cell is propagated to a subsequent stage of the delay cell and also back to the previous stage of the delay cell. In some embodiments, a signal S2 from the subsequent delay cell 200_9 is also inverted and propagated to the delay cell 200_7 via the tri-state inverter 220_8.

Figure 3D:
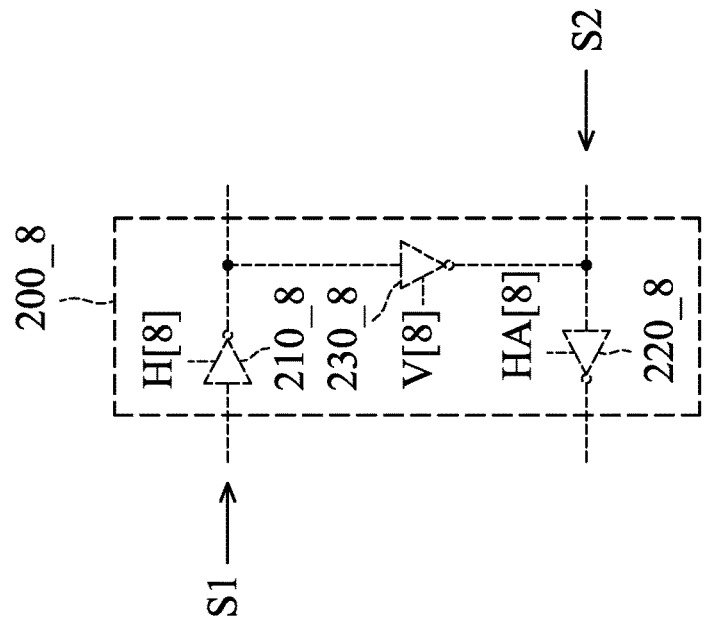
FIG. 3D shows an idle mode of a delay cell, in accordance with some embodiments of the disclosure.
Figure 3C:
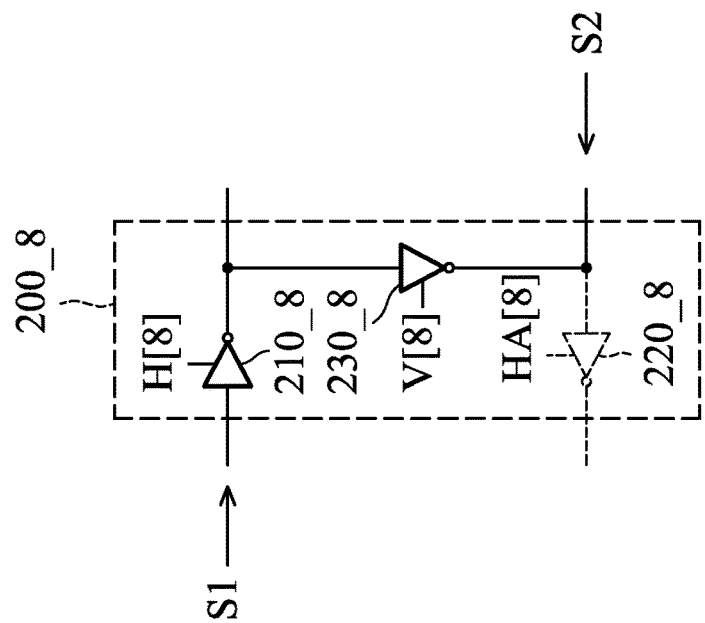
FIG. 3C shows a standby mode of the delay cell, in accordance with some embodiments of the disclosure.

FIG. 3C shows a standby mode of the delay cell 200_8, in accordance with some embodiments of the disclosure. In the standby mode, the tri-state inverter 210_8 is enabled by the control bit H[8], and the signal S1 from the delay cell 200_7 is inverted and propagated to the delay cell 200_9. Moreover, the tri-state inverter 230_8 is enabled by the control bit V[8], and the signal propagated by the tri-state inverter 210_8 is inverted and propagated to the tri-state inverter 220_8. Furthermore, the tri-state inverter 220_8 is disabled by the control bit HA[8], and a high-impedance output is provided to the delay cell 200_7 by the tri-state inverter 220_8, i.e. the signal propagated by the tri-state inverter 230_8 and the signal S2 from the delay cell 200_9 will not be propagated to the delay cell 200_7 via the tri-state inverter 220_8. Therefore, in the standby mode for each delay cell, the signal from a previous stage of the delay cell is propagated to a subsequent stage of the delay cell, and a high-impedance output is provided to the previous stage of the delay cell. Specifically, no return signal or the signal to be feedback is transmitted to the previous stage of the delay cell. Compared with the feedback mode of FIG. 3B, the tri-state inverter 220_8 is disabled, and then the tri-state inverters 210_8 and 230_8 are pre-enabled for propagating the signal S1 in FIG. 3C.

FIG. 3D shows an idle mode of a delay cell 200_8, in accordance with some embodiments of the disclosure. In the idle mode, the tri-state inverter 210_8 is disabled by the control bit H[8], and a high-impedance output is provided to the delay cell 200_9 by the tri-state inverter 210_8, i.e. the signal S1 from the delay cell 200_7 will not be propagated to the delay cell 200_9 via the tri-state inverter 210_8. Moreover, the tri-state inverter 230_8 is disabled by the control bit V[8], and no feedback path is formed in the delay cell 200_8. Furthermore, the tri-state inverter 220_8 is disabled by the control bit HA[8], and a high-impedance output is provided to the delay cell 200_7 by the tri-state inverter 220_8, i.e. the signal S2 from the delay cell 200_9 will not be propagated to the delay cell 200_7 via the tri-state inverter 220_8. Therefore, in the idle mode for each delay cell, no signal is propagated to the previous stage of the delay cell and the subsequent stage of the delay cell, and floating state occurs in the delay cell.

Figure 4A:
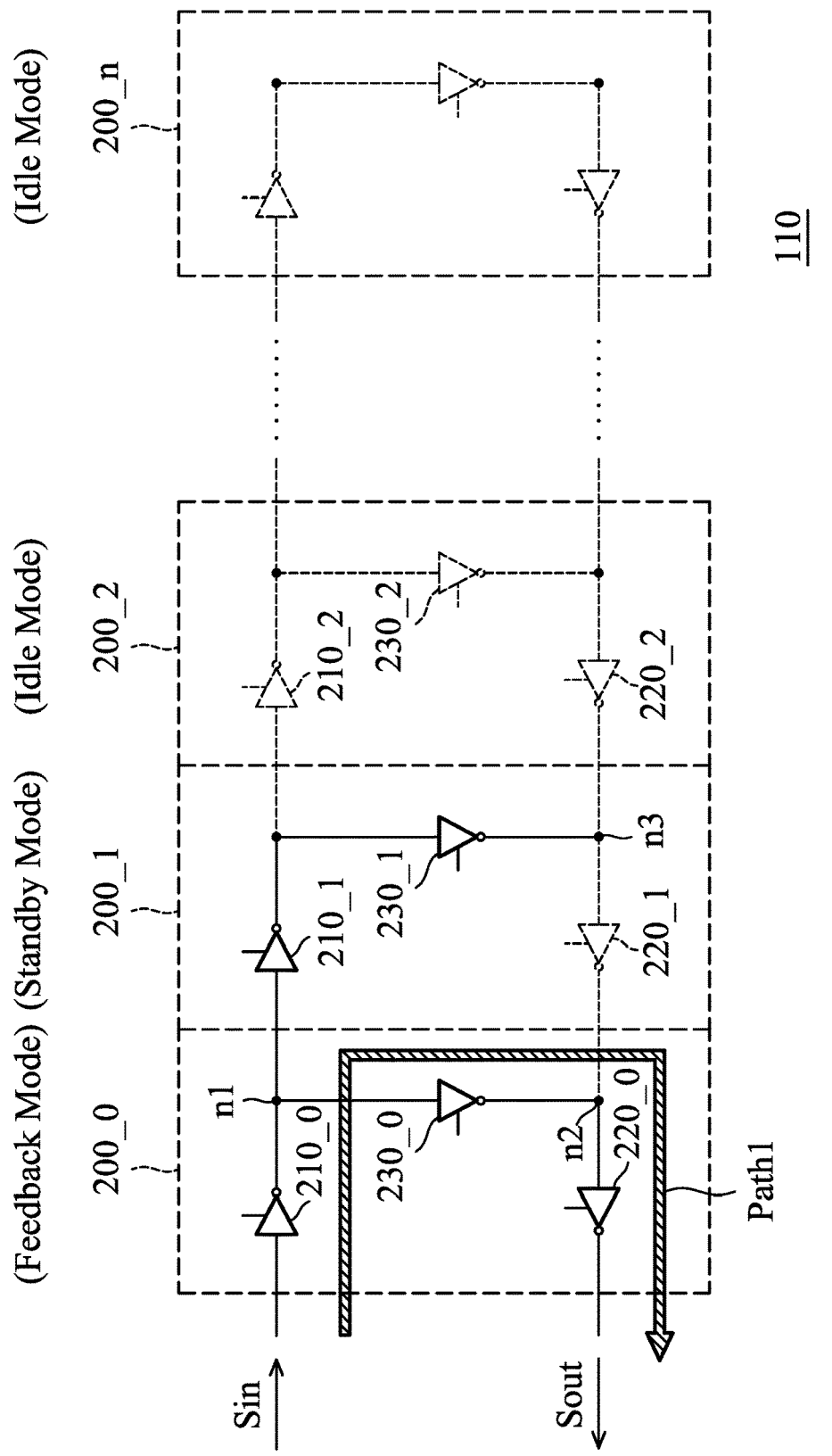
FIG. 4A shows a propagation path Path1 corresponding to a delay time D1 in the DCDL, in accordance with some embodiments of the disclosure.

FIG. 4A shows a propagation path Path1 corresponding to a delay time D1 in the DCDL 110, in accordance with some embodiments of the disclosure. In order to simplify the description, the control bits of the tri-state inverters are omitted. Furthermore, the enabled tri-state inverter is shown by a solid line, and the disabled tri-state inverter is shown by a dotted line.

In FIG. 4A, the delay cell 200_0 is operated in a feedback mode, the delay cell 200_1 is operated in a standby mode, and the delay cells 200_2 to 200_n are operated in an idle mode. Therefore, the five tri-state inverters 210_0, 210_1, 220_0, 230_0 and 230_1 are enabled in FIG. 4A. It should be noted that a single delay cell is operated in the feedback mode, and a subsequent stage of the delay cell following the single delay cell is operated in the standby mode. Furthermore, the other stages of the delay cells following the subsequent stage of the delay cell operated in the standby mode are operated in the idle mode. Furthermore, the propagation path Path1 is formed by the three tri-state inverters 210_0, 230_0 and 220_0, and a middle point (or a foldback point) of the propagation path Path1 is in the tri-state inverter 230_0 of the delay cell 200_0. For example, if a propagation path is formed by the seven tri-state inverters 210_0-210_2, 230_2 and 220_2-220_0, a middle point of the propagation path is in the tri-state inverter 230_2 of the delay cell 200_2.

In some embodiments, when a single delay cell is operated in the feedback mode, each following stage of the delay cell following the single delay cell is operated in the standby mode. Therefore, no floating state occurs in the DCDL 110 when all delay cells (e.g., 200_1 to 200_n) following the delay cell (e.g., 200_0) operated in the feedback mode are operated in the standby mode.

An input signal Sin is propagated and delayed by the delay time D1 to provide an output signal Sout via the propagation path Path1. The propagation path Path1 is formed by the three tri-state inverters 210_0, 230_0 and 220_0, and the delay time D1 is related to the number of tri-state inverters on the propagation path Path1. In such embodiments, the delay time D1 is equal or proportional to triple the unit delay $T_{INV}$ of a tri-state inverter, e.g., $D1=3*T_{INV}$.

If the delay time D1 is too small and need to be increased, the controller 120 of FIG. 1 will provide the control signal Ctrl to switch the operation modes of the delay cells 200_0 to 200_n, so as to form a new propagation path propagating and delaying the input signal Sin by an increased delay time to provide the output signal Sout.

Figure 4B:
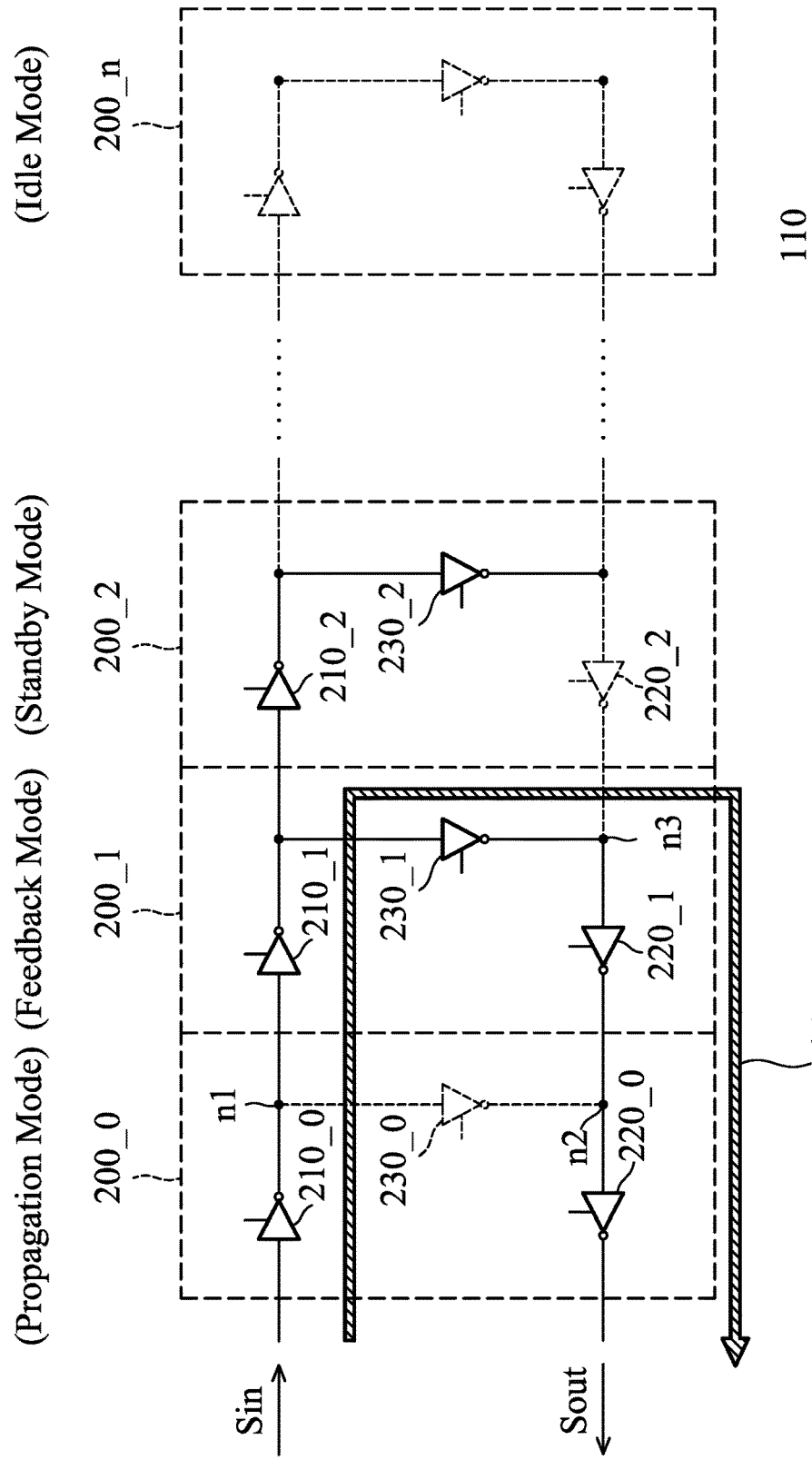
FIG. 4B shows a propagation path Path2 corresponding to a delay time D2 in the DCDL, in accordance with some embodiments of the disclosure.

FIG. 4B shows a propagation path Path2 corresponding to a delay time D2 in the DCDL 110, in accordance with some embodiments of the disclosure. In order to simplify the description, the control bits of the tri-state inverters are omitted. Furthermore, the enabled tri-state inverter is shown by a solid line, and the disabled tri-state inverter is shown by a dotted line.

In FIG. 4B, the delay cell 200_0 is operated in a propagation mode, the delay cell 200_1 is operated in a feedback mode, the delay cell 200_2 is operated in a standby mode, and the delay cells 200_3 to 200_n are operated in an idle mode. Therefore, the seven tri-state inverters 210_0, 210_1, 210_2, 220_0, 220_1, 230_1 and 230_2 are enabled. It should be noted that a single delay cell is operated in the feedback mode, and a subsequent stage of the delay cell following the single delay cell is operated in the standby mode, and the previous stage of the delay cell prior to the single delay cell is operated in the propagation mode. Furthermore, the other stages of the delay cells following the subsequent stage of the delay cell operated in the standby mode are operated in the idle mode. Furthermore, the propagation path Path2 is formed by the five tri-state inverters 210_0, 210_1, 230_1, 220_1 and 220_0, and a middle point (or a foldback point) of the propagation path Path2 is in the tri-state inverter 230_1 of the delay cell 200_1.

In some embodiments, when a single delay cell is operated in the feedback mode, each following stage of the delay cell following the single delay cell is operated in the standby mode. Therefore, no floating state occurs in the DCDL 110 when all delay cells (e.g., 200_2 to 200_n) following the delay cell (e.g., 200_1) operated in the feedback mode are operated in the standby mode.

An input signal Sin is propagated and delayed by the delay time D2 to provide an output signal Sout via the propagation path Path2. The propagation path Path2 is formed by the five tri-state inverters 210_0, 210_1, 230_1, 220_1 and 220_0, and the delay time D2 is related to the number of tri-state inverters on the propagation path Path2. In such embodiments, the delay time D2 is equal or proportional to five times the unit delay $T_{INV}$ of a tri-state inverter, e.g., $D2=5*T_{INV}$.

Referring to FIG. 4A and FIG. 4B together, the controller 120 of FIG. 1 changes the delay time from D1 to D2 with a delay step resolution $2*T_{INV}$ (e.g., $D2-D1=2*T_{INV}$) by changing the propagation path from Path1 to Path2.

Figure 4C:
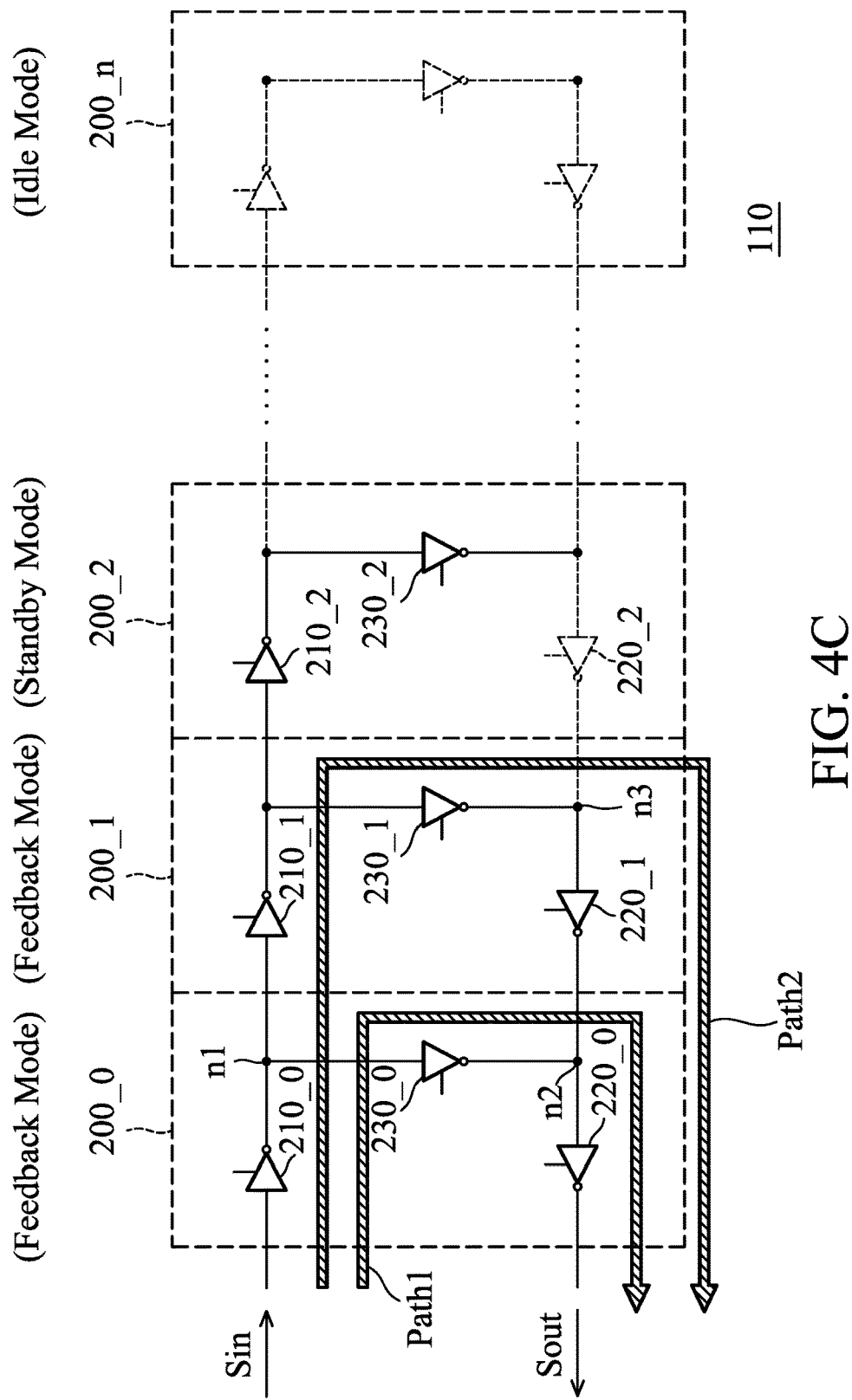
FIG. 4C shows a dual propagation paths Path1+Path2 corresponding to a delay time D3 in the DCDL, in accordance with some embodiments of the disclosure.

FIG. 4C shows a dual propagation paths Path1+Path2 corresponding to a delay time D3 in the DCDL 110, in accordance with some embodiments of the disclosure. In order to simplify the description, the control bits of the tri-state inverters are omitted. Furthermore, the enabled tri-state inverter is shown by a solid line, and the disabled tri-state inverter is shown by a dotted line.

In FIG. 4C, the delay cells 200_0 and 200_1 are both operated in a feedback mode, the delay cell 200_2 is operated in a standby mode, and the delay cells 200_3 to 200_n are operated in an idle mode. Therefore, the eight tri-state inverters 210_0, 210_1, 210_2, 220_0, 220_1, 230_0, 230_1 and 230_2 are enabled. It should be noted that a pair of delay cells are operated in the feedback mode, and a subsequent stage of the delay cell following the pair of delay cells is operated in the standby mode. Furthermore, the other stages of the delay cells following the subsequent stage of the delay cell operated in the standby mode are operated in the idle mode, and the previous stages of the delay cells prior to the pair of delay cells are operated in the propagation mode.

In some embodiments, when a pair of delay cells are operated in the feedback mode, each following stage of the delay cell following the pair of delay cells is operated in the standby mode. Therefore, no floating state occurs in the DCDL 110 when all delay cells (e.g., 200_2 to 200_n) following the delay cells (e.g., 200_0 to 200_1) operated in the feedback mode are operated in the standby mode.

An input signal Sin is propagated and delayed by a delay time D3 to provide an output signal Sout via the dual propagation paths Path1+Path2, simultaneously. As described above, the propagation path Path1 is formed by the three tri-state inverters 210_0, 230_0 and 220_0, and the propagation path Path2 is formed by the five tri-state inverters 210_0, 210_1, 230_1, 220_1 and 220_0. The delay time D3 is related to the number of tri-state inverters on the propagation paths Path1 and Path2. In some embodiments, the delay time D3 is obtained by averaging or interpolating the delay time D1 of the propagation path Path1 and the delay time D2 of the propagation path Path2, e.g., an average number of tri-state inverters on the propagation paths Path1 and Path2. Therefore, the delay time D3 is equal or proportional to four times the unit delay $T_{INV}$ of a tri-state inverter, e.g., $D3=(D1+D2)/2=4*T_{INV}$.

Referring to FIG. 4A and FIG. 4C together, when the controller 120 of FIG. 1 switches the single propagation path Path1 of FIG. 4A to the dual propagation paths Path1+Path2 of FIG. 4C, the delay time is changed from D1 to D3 with a delay step resolution $1*T_{INV}$ (e.g., $D3-D1=1*T_{INV}$). Therefore, a smaller delay step resolution (e.g., $1*T_{INV}$) is provided by propagated input signal Sin to provide the output signal Sout via the dual propagation paths Path1+Path2. It should be noted that the dual propagation paths Path1+Path2 are two neighboring propagation paths.

Referring to FIG. 4B and FIG. 4C together, when the controller 120 of FIG. 1 switches the dual propagation paths Path1+Path2 of FIG. 4C to the single propagation path Path2 of FIG. 4B, the delay time is changed from D3 to D2 with a delay step resolution $1*T_{INV}$ (e.g., $D2-D3=1*T_{INV}$).

Figure 5:
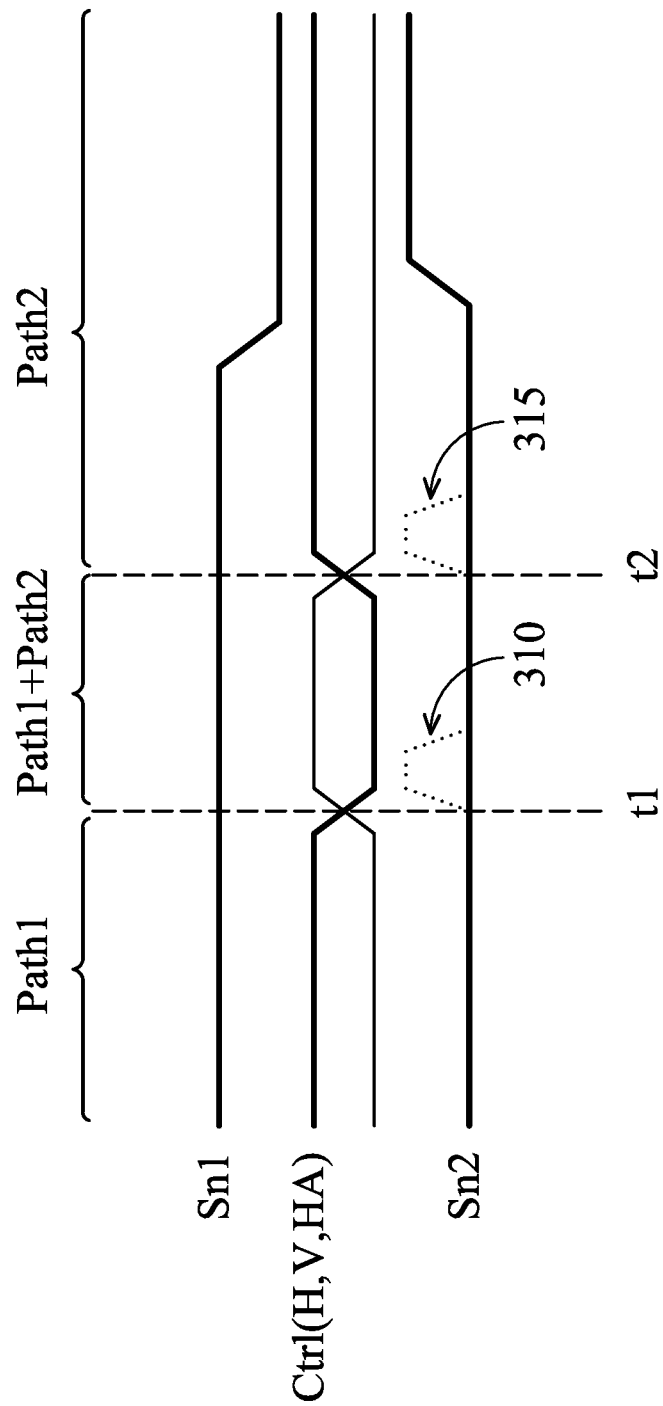
FIG. 5 shows a waveform illustrating the signals in the nodes n1 and n2 when the propagation path Path1 of FIG. 4A is changed to the propagation path Path2 of FIG. 4B via the dual propagation paths Path1+Path2 of FIG. 4C, in accordance with some embodiments of the disclosure.

FIG. 5 shows a waveform illustrating the signals in the nodes n1 and n2 when the propagation path Path1 of FIG. 4A is changed to the propagation path Path2 of FIG. 4B via the dual propagation paths Path1+Path2 of FIG. 4C, in accordance with some embodiments of the disclosure. In FIG. 5, "Sn1" represents a signal in the node n1 of the DCDL 110, "Ctrl(H,V,HA)" represents the control signal Ctrl from the controller 120 of FIG. 1, and "Sn2" represents a signal in the node n2 of the DCDL 110.

Referring to FIGS. 4A-4C and 5, for the propagation path Path1, the tri-state inverters 210_1 and 230_1 are enabled, and the input signal Sin is pre-propagated to the node n3. At the time point t1, the control signal Ctrl from the controller 120 of FIG. 1 is changed and the tri-state inverter 220_1 of the delay cell 200_1 is enabled, thereby the propagation path Path1 is changed to the dual propagation paths Path1+Path2. Due to the input signal Sin is pre-propagated to the node n3 via the tri-state inverters 210_1 and 230_1, the node n3 is not a floating node, and the signal of the node n3 is propagated to the node n2 via the tri-state inverter 220_1 without a glitch 310 occurring when the propagation path Path1 is changed to the dual propagation paths Path1+Path2. In general, glitches can occur when an input terminal of a logic cell is coupled to a floating node. Furthermore, by switching a single tri-state inverter (e.g., enabling the tri-state inverter 220_1 of the delay cell 200_1) to change the propagation path Path1 to the dual propagation paths Path1+Path2, interference caused by device-switching is decreased in the propagation path.

At the time point t2 of FIG. 5, the control signal Ctrl from the controller 120 of FIG. 1 is changed and the tri-state inverter 230_0 of the delay cell 200_0 is disabled, thereby the dual propagation paths Path1+Path2 is changed to the propagation path Path2. Similarly, the node n3 is not a floating node, and the signal of the node n3 is propagated to the node n2 via the tri-state inverter 220_1 without a glitch 315 occurring when the dual propagation paths Path1+Path2 is changed to the propagation path Path2. Furthermore, by switching a single tri-state inverter (e.g., disabling the tri-state inverter 230_0 of the delay cell 200_0) to change the dual propagation paths Path1+Path2 to the propagation path Path2, interference caused by device-switching is decreased in the propagation path.

Figure 6A:
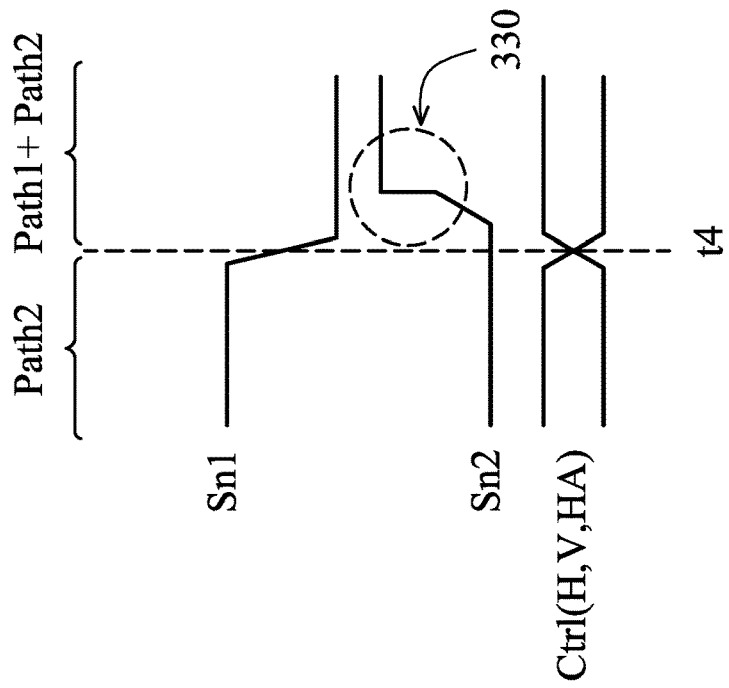
FIG. 6A shows a waveform illustrating the signals in the nodes n1 and n2 when the dual propagation paths Path1+Path2 of FIG. 4C is changed to the single propagation path Path2 of FIG. 4B, in accordance with some embodiments of the disclosure.

FIG. 6A shows a waveform illustrating the signals in the nodes n1 and n2 when the dual propagation paths Path1+Path2 of FIG. 4C is changed to the single propagation path Path2 of FIG. 4B, in accordance with some embodiments of the disclosure. In FIG. 6A, "Sn1" represents a signal in the node n1 of the DCDL 110, "Ctrl(H,V,HA)" represents the control signal Ctrl from the controller 120 of FIG. 1, and "Sn2" represents a signal in the node n2 the DCDL 110.

Referring to FIGS. 4B, 4C and 6A, at the time point t3, the control signal Ctrl from the controller 120 of FIG. 1 is changed and the tri-state inverter 230_0 of the delay cell 200_0 is disabled, thereby the dual propagation paths Path1+Path2 is changed to the single propagation path Path2. Furthermore, the slew rate of the signal Sn2 in the node n2 is slowed down due to the degraded driving strength of the tri-state inverter caused by the disabled tri-state inverter 230_0, as shown in label 320 of FIG. 6A. Similarly, no glitches happen during the step-by-step, successive path-switching with the delay step resolution $1*T_{INV}$ from a shorter delay (e.g., the dual propagation paths Path1+Path2) to a longer delay (e.g., the propagation path Path2). Furthermore, by switching a single tri-state inverter (e.g., disabling the tri-state inverter 230_0 of the delay cell 200_0) to change the dual propagation path Path1+Path2 to the single propagation path Path2, interference caused by device-switching is decreased in the propagation path. Therefore, even if the path-switching happened exactly at the instant of signal rising (or falling) transient (e.g., the signal Sn1 at the time point t3), there would be no glitch, and the rising (or falling) transient time will change in response to the path switching.

Figure 6B:
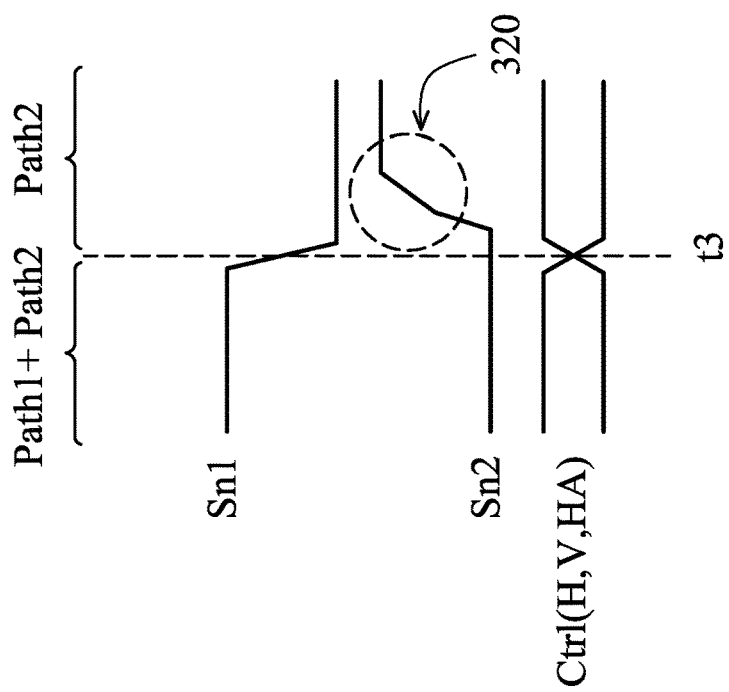
FIG. 6B shows a waveform illustrating the signals in the nodes n1 and n2 when the single propagation path Path2 of FIG. 4B is changed to the dual propagation paths Path1+Path2 of FIG. 4C, in accordance with some embodiments of the disclosure.

FIG. 6B shows a waveform illustrating the signals in the nodes n1 and n2 when the single propagation path Path2 of FIG. 4B is changed to the dual propagation paths Path1+Path2 of FIG. 4C, in accordance with some embodiments of the disclosure. In FIG. 6B, "Sn1" represents a signal in the node n1 of the DCDL 110, "Ctrl(H,V,HA)" represents the control signal Ctrl from the controller 120 of FIG. 1, and "Sn2" represents a signal in the node n2 the DCDL 110.

Referring to FIGS. 4B, 4C and 6B, at the time point t4, the control signal Ctrl from the controller 120 of FIG. 1 is changed and the tri-state inverter 230_0 of the delay cell 200_0 is enabled, thereby the single propagation path Path2 is changed to the dual propagation paths Path1+Path2. Furthermore, the slew rate of the signal Sn2 in the node n2 is sped up due to the enhanced driving strength of the tri-state inverter caused by the enabled tri-state inverter 230_0, as shown in label 330 of FIG. 6B. Similarly, there is no glitch that happens during the step-by-step, successive path-switching with the delay step resolution $1*T_{INV}$ from a longer delay (e.g., the propagation path Path2) to a shorter delay (e.g., the dual propagation paths Path1+Path2). Furthermore, by switching a single tri-state inverter (e.g., enabling the tri-state inverter 230_0 of the delay cell 200_0), the propagation path is changed from Path2 to Path1+Path2, thereby decreasing interference in the propagation path caused by device switching. Therefore, even if the path-switching happened exactly at the instant of signal rising (or falling) transient, there would be no glitch, and the rising (or falling) transient time will change in response to the path switching.

Embodiments for glitch-free digital controlled delay line (DCDL) are provided. The DCDL includes multi delay cells connected in a chain. Each delay cell can operate in a propagation mode, a feedback mode, a standby mode, and an idle mode. By controlling the mode of each delay cell in the DCDL, a propagation path is formed for propagating and delaying an input signal Sin to provide an output signal Sout. When a single delay cell or a pair of delay cells are operated in the feedback mode, a subsequent stage of the delay cell following the single delay cell or the pair of delay cells is operated in the standby mode, to prevent a floating node, and thereby no glitch occurs when the propagation path is changed.

In some embodiments, a digital controlled delay line is provided. The digital controlled delay line includes a plurality of delay cells coupled in a chain. The delay cells form a first propagation path to propagate an input signal and to delay the input signal by a first delay. Each of the delay cells has: a propagation mode for propagating a first signal from a previous stage of the delay cell to a subsequent stage of the delay cell and propagating a second signal from the subsequent stage of the delay cell to the previous stage of the delay cell; a feedback mode for propagating the first signal from the previous stage of the delay cell to the subsequent stage of the delay cell and back to the previous stage of the delay cell; a standby mode for propagating the first signal from the previous stage of the delay cell to the subsequent stage of the delay cell, and providing a first high-impedance output to the previous stage of the delay cell; and an idle mode for providing the first high-impedance output to the previous stage of the delay cell, and providing a second high-impedance output to the subsequent stage of the delay cell. The first propagation path is formed when a single delay cell in the chain is operated in the feedback mode, the delay cells previous to the single delay cell in the chain are operated in the propagation mode, a first subsequent delay cell following the single delay cell in the chain is operated in the standby mode, and the delay cells following the first subsequent delay cell in the chain are operated in the idle mode.

In some embodiments, a digital controlled delay line is provided. The digital controlled delay line includes the first to fifth inverters. The first inverter has an input terminal for receiving an input signal. The second inverter has an input terminal coupled to the input terminal of the first inverter. The third inverter has an input terminal coupled to an output terminal of the second inverter. The fourth inverter has an input terminal coupled to an output terminal of the third inverter. The fifth inverter has an input terminal coupled to output terminals of the first and fourth inverters, and an output terminal for providing an output signal.

In some embodiments, a digital controlled delay line is provided. The digital controlled delay line includes a plurality of first tri-state inverters coupled in series and controlled by a first set of control signals, a plurality of second tri-state inverters coupled in series and controlled by a second set of control signals, and a plurality of third tri-state inverters controlled by a third set of control signals. A third tri-state inverter of the third tri-state inverters has an input terminal coupled to an input terminal of an individual first tri-state inverter, and an output terminal coupled to an output terminal of an individual second tri-state inverter. When one of the third tri-state inverters is enabled, an input signal is propagated and delayed by a first delay time via a first propagation path, and the first propagation path is formed by the enabled third tri-state inverter, each of the first tri-state inverters having an output terminal coupled to the input terminal of the enabled third tri-state inverter, and each of the second tri-state inverters having an input terminal coupled to the output terminal of the enabled third tri-state inverter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A digital controlled delay line, comprising:
   a plurality of delay cells coupled in a chain, forming a first propagation path to propagate an input signal and to delay the input signal by a first delay time,
   wherein each of the delay cells is configured to operate in:
   a propagation mode for propagating a first signal from a previous stage of a delay cell to a subsequent stage of the delay cell and propagating a second signal from the subsequent stage of the delay cell to the previous stage of the delay cell;
   a feedback mode for propagating the first signal from the previous stage of the delay cell to the subsequent stage of the delay cell and back to the previous stage of the delay cell;
   a standby mode for propagating the first signal from the previous stage of the delay cell to the subsequent stage of the delay cell, and providing a first high-impedance output to the previous stage of the delay cell; or
   an idle mode for providing the first high-impedance output to the previous stage of the delay cell, and providing a second high-impedance output to the subsequent stage of the delay cell,
   wherein the first propagation path is formed when a single delay cell in the chain is operated in the feedback mode, the delay cells previous to the single delay cell in the chain are operated in the propagation mode, a first subsequent delay cell following the single delay cell in the chain is operated in the standby mode, and the delay cells following the first subsequent delay cell in the chain are operated in the idle mode.

2. The digital controlled delay line as claimed in claim 1, wherein each of the delay cells comprises:
  a first tri-state inverter controlled by a first control signal, having an input terminal coupled to the previous stage of the delay cell, and an output terminal coupled to the subsequent stage of the delay cell;
  a second tri-state inverter controlled by a second control signal, having an input terminal coupled to the subsequent stage of the delay cell, and an output terminal coupled to the previous stage of the delay cell; and
  a third tri-state inverter controlled by a third control signal, having an input terminal coupled to the output terminal of the first tri-state inverter, and an output terminal coupled to the input terminal of the second tri-state inverter.

3. The digital controlled delay line as claimed in claim 2, wherein the first delay time is proportional to the number of enabled first, second, and third tri-state inverters of the delay cells on the first propagation path,
  wherein in the propagation mode, the first and second tri-state inverters are enabled by the first and second control signals, respectively, and the third tri-state inverter is disabled by the third control signal,
  wherein in the feedback mode, the first, second and third tri-state inverters are enabled by the first, second and third control signals, respectively,
  wherein in the standby mode, the first and third tri-state inverters are enabled by the first and third control signals, respectively, and the second tri-state inverter is disabled by the second control signal,
  wherein in the idle mode, the first, second and third tri-state inverters are disabled by the first, second and third control signals, respectively.

4. The digital controlled delay line as claimed in claim 1, wherein the delay cells in the chain form a second propagation path to propagate the input signal and to delay the input signal by a second delay time, wherein the second propagation path is formed when a pair of delay cells are operated in the feedback mode, and the delay cells previous to the pair of delay cells in the chain are operated in the propagation mode, wherein the pair of delay cells comprises the single delay cell and the first subsequent delay cell.

5. The digital controlled delay line as claimed in claim 4, wherein when the second propagation path is formed, a second subsequent delay cell following the first subsequent delay cell in the chain is operated in the standby mode, and the delay cells following the second subsequent delay cell in the chain are operated in the idle mode.

6. The digital controlled delay line as claimed in claim 4, wherein the first delay time is shorter than the second delay time.

7. The digital controlled delay line as claimed in claim 4, wherein the number of enabled first, second, and third tri-state inverters of the delay cells on the first propagation path is N, and the first delay time is proportional to N and the second delay time is proportional to N+1.

8. A digital controlled delay line, comprising:
  a first inverter, having an input terminal for receiving an input signal;
  a second inverter, having an input terminal coupled to the input terminal of the first inverter;
  a third inverter, having an input terminal coupled to an output terminal of the second inverter;
  a fourth inverter, having an input terminal coupled to an output terminal of the third inverter; and
  a fifth inverter, having an input terminal coupled to an output terminal of the first inverter for receiving the input signal through the first inverter and an output terminal of the fourth inverter for receiving the input signal through the second, third and fourth inverters, and an output terminal for providing an output signal.

9. The digital controlled delay line as claimed in claim 8, further comprising:
  a sixth inverter, having an input terminal coupled to an output terminal of the second inverter;
  a seventh inverter, having an input terminal coupled to an output terminal of the sixth inverter; and
  an eighth inverter, having an input terminal coupled to an output terminal of the seventh inverter, and an output terminal coupled to the input terminal of the fourth inverter.

10. The digital controlled delay line as claimed in claim 9, wherein the inverters are tri-state inverters controlled by corresponding control signals, and when the first to seventh inverters are enabled and the eighth inverter is disabled by corresponding control signals, the input signal is propagated and delayed by a first delay time to provide the output signal.

11. The digital controlled delay line as claimed in claim 10, wherein when the second to seventh inverters are enabled and the first and the eighth inverter are disabled by corresponding control signals, the input signal is propagated and delayed by a second delay time to provide the output signal, and the second delay time is longer than the first delay time.

12. The digital controlled delay line as claimed in claim 8, further comprising:
  at least one ninth inverter, having an output terminal for providing the input signal; and
  at least one tenth inverter, having an input terminal for receiving the output signal.

13. A digital controlled delay line, comprising:
  a plurality of first tri-state inverters coupled in series and controlled by a first set of control signals;
  a plurality of second tri-state inverters coupled in series and controlled by a second set of control signals; and
  a plurality of third tri-state inverters controlled by a third set of control signals, wherein a third tri-state inverter of the third tri-state inverters has an input terminal coupled to an input terminal of an individual first tri-state inverter, and an output terminal coupled to an output terminal of an individual second tri-state inverter,
  wherein when one of the third tri-state inverters is enabled, an input signal is propagated and delayed by a first delay time via a first propagation path, and the first propagation path is formed by the enabled third tri-state inverter, each of the first tri-state inverters having an output terminal coupled to the input terminal of the enabled third tri-state inverter, and each of the second tri-state inverters having an input terminal coupled to the output terminal of the enabled third tri-state inverter,
  wherein when the first propagation path is formed, a first tri-state inverter having an input terminal directly coupled to the input terminal of the enabled third tri-state inverter is pre-enabled by a control signal of the first set of control signals.

14. The digital controlled delay line as claimed in claim 13, wherein when the one of the third tri-state inverters is enabled, each of the second tri-state inverters having input terminal coupled to the output terminal of the enabled third tri-state inverter is enabled, and each of the second tri-state inverters having output terminal coupled to the output terminal of the enabled third tri-state inverter is disabled.

15. The digital controlled delay line as claimed in claim 13, wherein when the first propagation path is formed, a third tri-state inverter having an input terminal directly coupled to the pre-enabled first tri-state inverter is pre-enabled by a control signal of the third set of control signals, and wherein when the one of the third tri-state inverters is enabled, each of the first tri-state inverters having output terminal coupled to the input terminal of the enabled third tri-state inverter is enabled, and each of the first tri-state inverters having input terminal coupled to the input terminal of enabled third tri-state inverter other than the pre-enabled first tri-state inverter is disabled.

16. The digital controlled delay line as claimed in claim 15, wherein when the first propagation path is formed, each of the third tri-state inverters outside the first propagation path and except for the pre-enabled third tri-state inverter is disabled.

17. The digital controlled delay line as claimed in claim 15, wherein when the first propagation path is formed and the second tri-state inverter between the enabled third tri-state inverter and the pre-enabled third tri-state inverter is enabled, the input signal is propagated and delayed by a second delay time via the first propagation path and a second propagation path, simultaneously.

18. The digital controlled delay line as claimed in claim 17, wherein the second propagation path is formed by the pre-enabled third tri-state inverter, each of the first tri-state inverters having an output terminal coupled to the input terminal of the pre-enabled third tri-state inverter, and each of the second tri-state inverters having an input terminal coupled to the output terminal of the pre-enabled third tri-state inverter.

19. The digital controlled delay line as claimed in claim 17, wherein the first delay time is shorter than the second delay time, wherein the first delay time is proportional to the number of first, second, and third tri-state inverters on the first propagation path, and the second delay time is proportional to an average number of first, second, and third tri-state inverters on the first and second propagation paths.

20. The digital controlled delay line as claimed in claim 17, wherein when the second propagation path is formed, the first tri-state inverter having an input terminal directly coupled to the input terminal of the pre-enabled third tri-state inverter is enabled, and the second tri-state inverter having an output terminal directly coupled to the output terminal of the pre-enabled third tri-state inverter is disabled.

* * * * *